United States Patent [19]

DeVries

[11] 4,031,371

[45] June 21, 1977

[54] MICROCOMPUTER BOARD HAVING WIRE-WRAP TERMINALS

[75] Inventor: Hubert G. DeVries, Littleton, Colo.

[73] Assignee: Monolithic Systems Corporation, Englewood, Colo.

[22] Filed: Mar. 8, 1976

[21] Appl. No.: 664,815

[52] U.S. Cl. ............................... 235/152; 174/68.5
[51] Int. Cl.² ........................................ H05K 7/08
[58] Field of Search .......... 235/152, 156; 174/68.5; 317/101 C; 29/203 B, 626

[56] References Cited

UNITED STATES PATENTS

| | | | |
|---|---|---|---|
| 3,670,208 | 6/1972 | Hovnanian | 174/68.5 X |
| 3,751,645 | 8/1971 | Brandsma et al. | 235/152 |
| 3,780,211 | 12/1973 | Vernet | 174/68.5 |
| 3,917,984 | 11/1975 | Kong et al. | 174/68.5 X |
| 3,935,372 | 1/1976 | Triplett et al. | 174/68.5 |

Primary Examiner—David H. Malzahn
Attorney, Agent, or Firm—Daniel M. Rosen

[57] ABSTRACT

A microcomputer board has a first section with fixedly mounted microcomputer components interconnected by a printed circuit, and a second section having unconnected wire-wrap terminals adapted to receive DIP components. Wire-wrap terminals are provided for interconnecting the printed circuit with the wire-wrap section of the board, and additional wire-wrap terminals are provided for I/O connections. A ground plane extends between the wire-wrap connectors, on one side of the board, and voltage planes extend between the wire-wrap terminals on the other side of the board. Wire-wrap terminals may be provided in the wire-wrap section of the board and connected to the voltage and ground planes.

11 Claims, 6 Drawing Figures

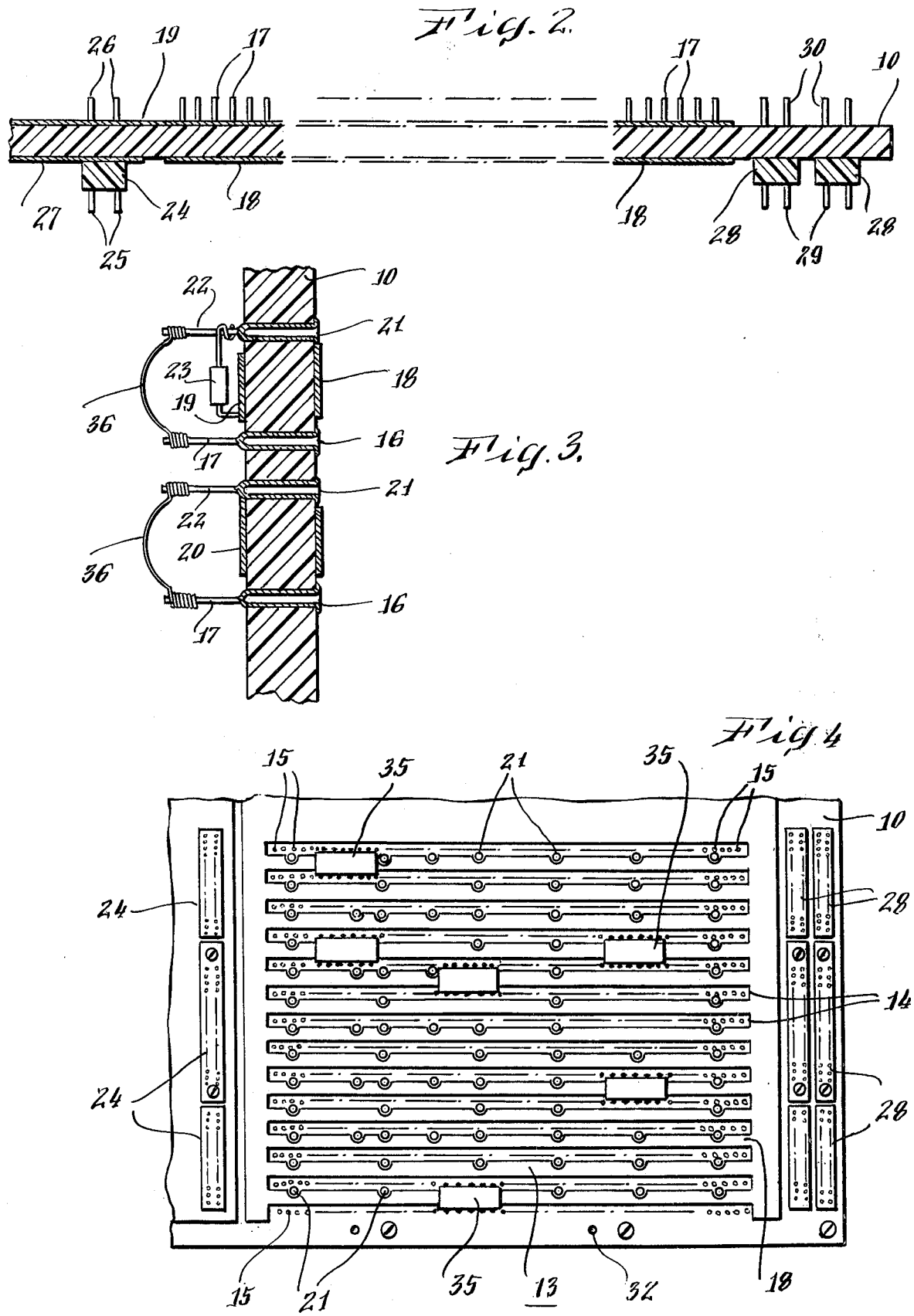

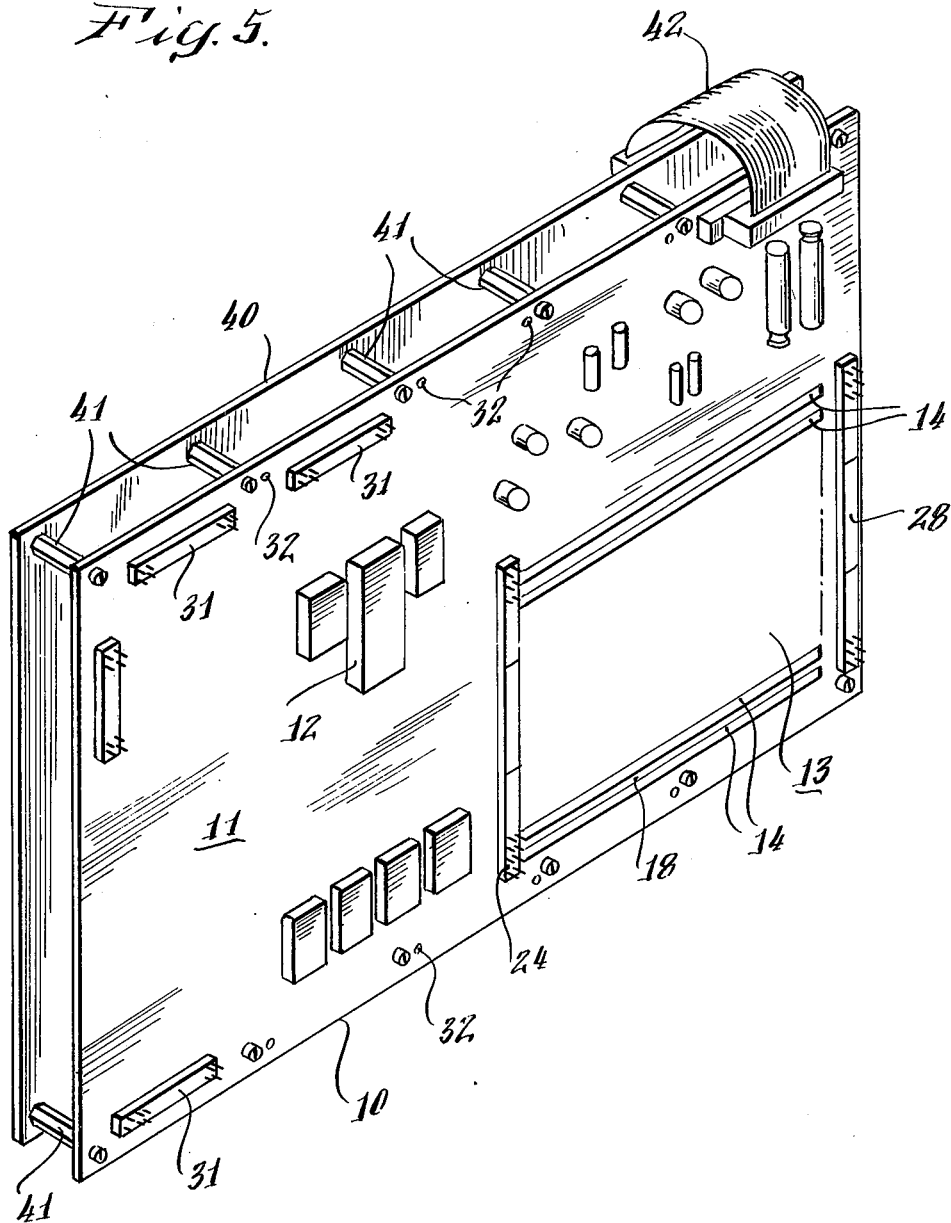

MICROCOMPUTER BOARD HAVING WIRE-WRAP TERMINALS

THE INVENTION

This invention relates to microcomputers, and is particularly directed to the provision of a microcomputer readily adaptable to low quantity production with a minimum of cost and effort.

There have recently been drastic reductions in the cost of microprocessor chips and as a result, microcomputer technology is presently revolutionizing many of today's products. It is thus expected that in the future, microcomputers will be as basic to systems design as integrated circuits are now to circuit design. At the present time, in order to use a microprocessor, the designer must construct a microcomputer system composed of the basic microcomputer hardware, system interface hardware, PROM and RAM memories, and the necessary software programs for doing useful work.

In one technique for developing microcomputer systems, minicomputer systems may be employed. This technique is low in efficiency and cost effectiveness, however, and does not result in hardware that is used in the end application. As a consequence, it is preferably to design a microcomputer system on the basis of hardware that will be used in the final product. Such design requires the use of a suitable microprocessor, a flexible I/O, and an option of various memories. It is, of course, preferable that these components be available in a minimum package size. The designer must also have available a programming station with sufficient capability to efficiently write and debug programs. In order to fulfill these requirements, the developer must have, as a minimum hardware requirement, a microcomputer, a random access memory, a control panel, and a teletype terminal.

The present invention is therefore directed to the provision of a microprocessor board that meets these requirements, as well as enables the provision of a microcomputer, particularly a microcomputer for low quantity production, with a minimum of cost and effort.

Briefly stated, in accordance with the invention, a microcomputer board is provided having a first section wherein basic microcomputer components are fixedly attached and interconnected by means of a printed circuit. These elements may include a central processing unit chip, a clock generator, necessary interface circuits and buffers, and preferably, also, a power inverter for providing all of the necessary voltages for the system. Since this portion of the system is basic to the microcomputer, and comprises a fixed part of the system, it may be mass produced so that its basic cost is as low as possible.

In order to adapt the microcomputer for its desired end use, the microcomputer board is further provided with a wire-wrap section. This section includes a plurality of individual connectors spaced to receive conventionally available integrated circuits, for example, DIP packages. The connectors have wire-wrap terminals on one side of the board. In addition, the wire-wrap section of the board is provided with wire-wrap terminals connected to the printed circuits, in order to enable interconnection by the user of components plugged into the wire-wrap section with the basic microcomputer circuit. These additional connectors may also have pins for interconnection with external circuits to expand the functions of the system.

The wire-wrap section of the board further includes wire-wrap terminals unconnected to the printed circuits, and also having pins adapted to be connected to external circuitry. These latter wire-wrap terminals thereby enable interconnection of the elements in the wire-wrap section to external circuits, whereby any desired I/O interconnections may be provided.

A ground plane is provided on the board between the rows of wire-wrap terminals on one side thereof, and voltage planes are provided between the wire-wrap terminals on the other side of the board. Further wire-wrap terminals are provided in the wire-wrap section interconnected with the voltage and ground planes, and the voltage and ground planes are connected to the printed circuit. As a consequence, the necessary voltages for components plugged into the wire-wrap section of the board are readily available.

With this arrangement, any desired additional components may be plugged into the wire-wrap section to adapt the basic microcomputer to special applications with a minimum of cost and a minimum of effort. The development time for a microcomputer system is thereby reduced, since the basic microcomputer system and the operating potentials are readily available. As a consequence, the cost for providing a microcomputer for low quantity and special applications is considerably reduced.

The microcomputer board may be provided with still further terminals connected to the printed circuit, in order, for example, to expand the memory capability of the system, as well as to interconnect the microcomputer with a control panel or the like. The basic components for the microcomputer, as well as the components which adapt the microcomputer to special applications, however, are all on a common board, whereby the adaptation of the basic microcomputer to special applications is readily and simply achieved.

In order that the invention will be more clearly understood, it will now be disclosed in greater detail with reference to the accompanying drawings, wherein:

FIG. 2 is an enlarged cross-sectional view of a portion of the board of FIG. 1, taken along the lines II—II;

FIG. 3 is an enlarged cross-sectional view of the board of FIG. 1, normal to the illustration of FIG. 2 and taken along lines III—III;

FIG. 4 is a front view of the board of FIG. 1 with additional components added to the wire-wrap section;

FIG. 5 is a perspective view of the board of FIG. 1 interconnected with a further board.

Figure 1:
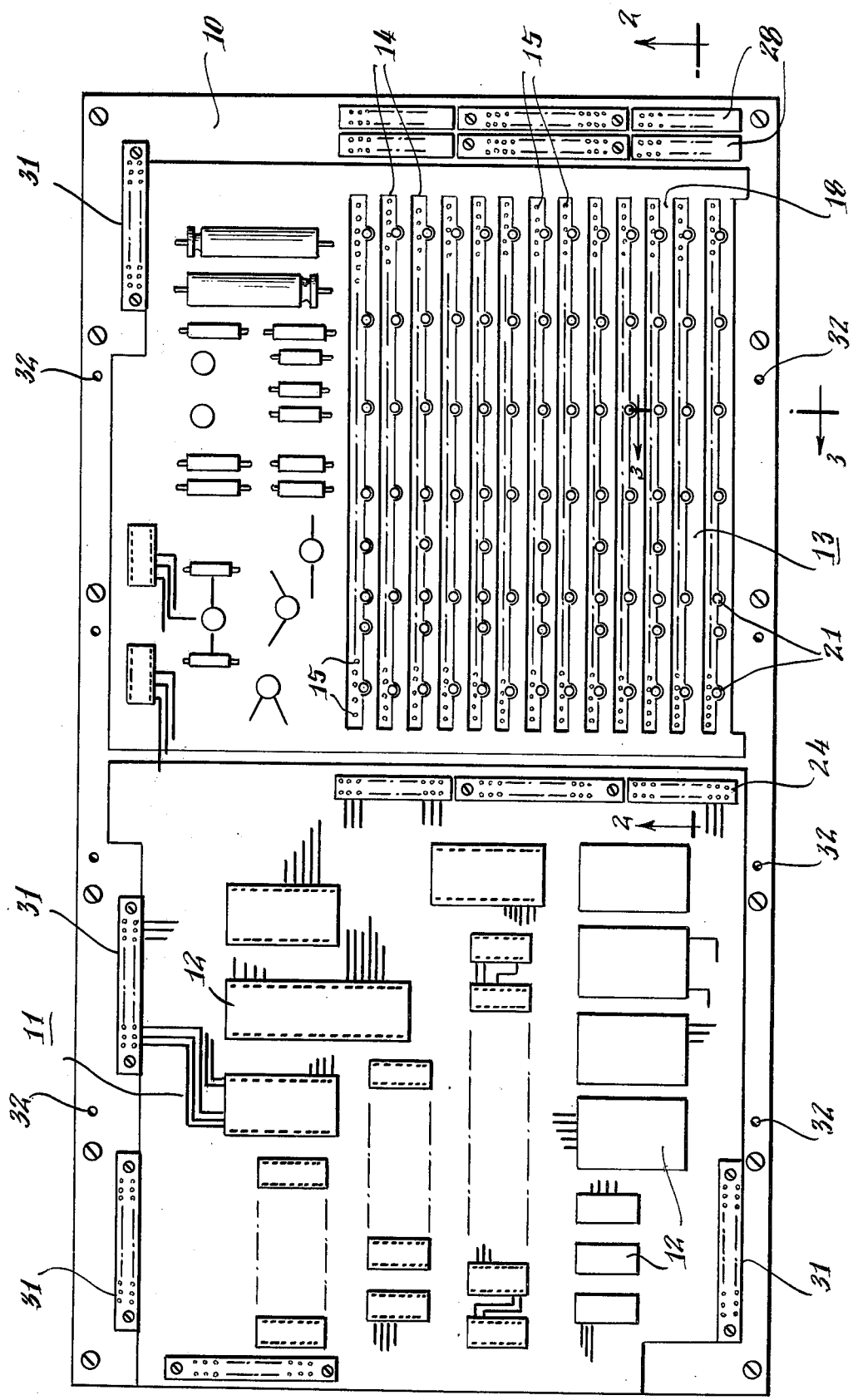
FIG. 1 is a view of one side of a microcomputer board in accordance with the invention.

Referring now to the drawings, and more in particular to FIGS. 1-3, the microcomputer board in accordance with the invention is comprised of an insulating board 10 of outer dimensions of, for example only, about 13½ × 7½ inches. The board is provided with one section, generally denoted by the reference numeral 11, wherein microcomputer components are fixedly attached to the board, and interconnected by conventional printed circuit wiring. The wiring may be provided on both sides of the board. The microcomputer board may employ conventional circuitry, and include, for example, a central processing unit chip 12, such as a type 8080 CPU, as well as other conventional elements such as PROM's memory, input signal and control panel interfaces, buffers, a clock generator and a power inverter.

The board 10 further includes a wire-wrap section generally denoted by the reference numeral 13. This section of the board includes a plurality of parallel rows 14 of aligned holes 15 in which are inserted individual connectors 16, as illustrated in FIG. 3. The connectors 16 have wire-wrap pins 17 extending from the rear of the board, i.e., the side opposite the side illustrated in FIG. 1. The holes 15 are spaced apart in each row, and the rows are spaced apart standard distances to receive dual in-line integrated circuits. For example, the holes are preferably spaced apart by 0.3 inches in each row. In one embodiment of the invention, the wire-wrap section 13 was about 4¼ × 7 inches, having 14 rows of holes, with about 55 holes in each row. This arrangement allowed the insertion in the wire-wrap section of any combination of 8, 14, 16, 18, 24, 36 or 40 pin DIP devices.

In addition, on the side of the board illustrated in FIG. 1, a common ground plane 18, connected to the printed circuit on the board, extends between the rows of holes. On the other side of the board, as illustrated in FIG. 3, voltage plane 19 and 20 extend on the surface of the board between different rows of holes, these voltage planes being connected to desired voltage levels in the printed circuit. It will, of course, be apparent that additional voltage planes may be provided between other rows of holes.

The board 10, in the wire-wrap section 13, is further provided with a plurality of additional individual connectors 21. These connectors 21 are not in the rows 14, but are spaced slightly therefrom. The voltage and ground planes may have cut-outs, so that these voltage and ground planes may be insulated from the connectors 21. The connectors 21 have wire-wrap pins 22 on the rear side of the board, as illustrated in FIG. 3. As further illustrated in FIG. 3, the connectors 21 are electrically connected to either the ground planes 18 or the voltage planes 19 or 20. As a result, wire-wrap voltage and ground pins are available at a number of locations in the wire-wrap section 13. Bypass capacitors, such as the capacitor 23 connected between a voltage plane and a connector connected to a ground plane, are provided for eliminating noise interference.

At one side of the wire-wrap section, a plurality of further connectors 24 are provided. These connectors have pins 25 extending from the front of the board, for interconnection with external circuitry, and the pins 25 extend through the board to wire-wrap terminal 26 at the rear of the board. The pins 25 are connected by conventional manner to the printed circuit in the area 11 of the board, for example, by a printed circuit lead 27 as illustrated in FIG. 2. It is thus apparent that wire-wrap terminals connected to the signal leads of the microcomputer circuit are available in the wire-wrap section 13. The connectors 24 may, for example, be pin ribbon connectors of conventional design.

The board is further provided, in the wire-wrap section, with a plurality of additional connectors 28. These connectors have pins 29 extending outwardly from the front of the board, and wire-wrap terminals 30 connected to the pins and extending from the rear of the board as illustrated in FIG. 2. These connectors are not connected to the printed circuit, and may comprise pin ribbon connectors for connecting the microcomputer board to external circuits. It will, of course, be apparent that additional connectors, such as the connectors 31 may be provided in the area 11 of the board and connected to the printed circuit, for interconnection of other elements, such as an additional memory card to the circuit. The board 10 may thus be provided with peripheral holes 32 enabling the parallel interconnection of other boards therewith.

As illustrated in FIG. 4, conventional DIP integrated circuits 35 may be inserted by the user in the wire-wrap section. These integrated circuits may be interconnected with the ground and voltage planes, as well as the connectors 24, 28 by the user, for example, by wires such as the wires 36 illustrated in FIG. 3, in order to adapt the microcomputer to the desired function.

As illustrated in FIG. 5, additional boards, such as the board 40 may be connected in parallel with the board 10, for example, by means of spaces 41. The board 40 may comprise an additional RAM card for further memory in the microcomputer, and it may be connected to the board 10, at one of the connectors 31, by means of a ribbon connector 42. It will be apparent that other accessories may be similarly connected to the board 10.

Figure 6:
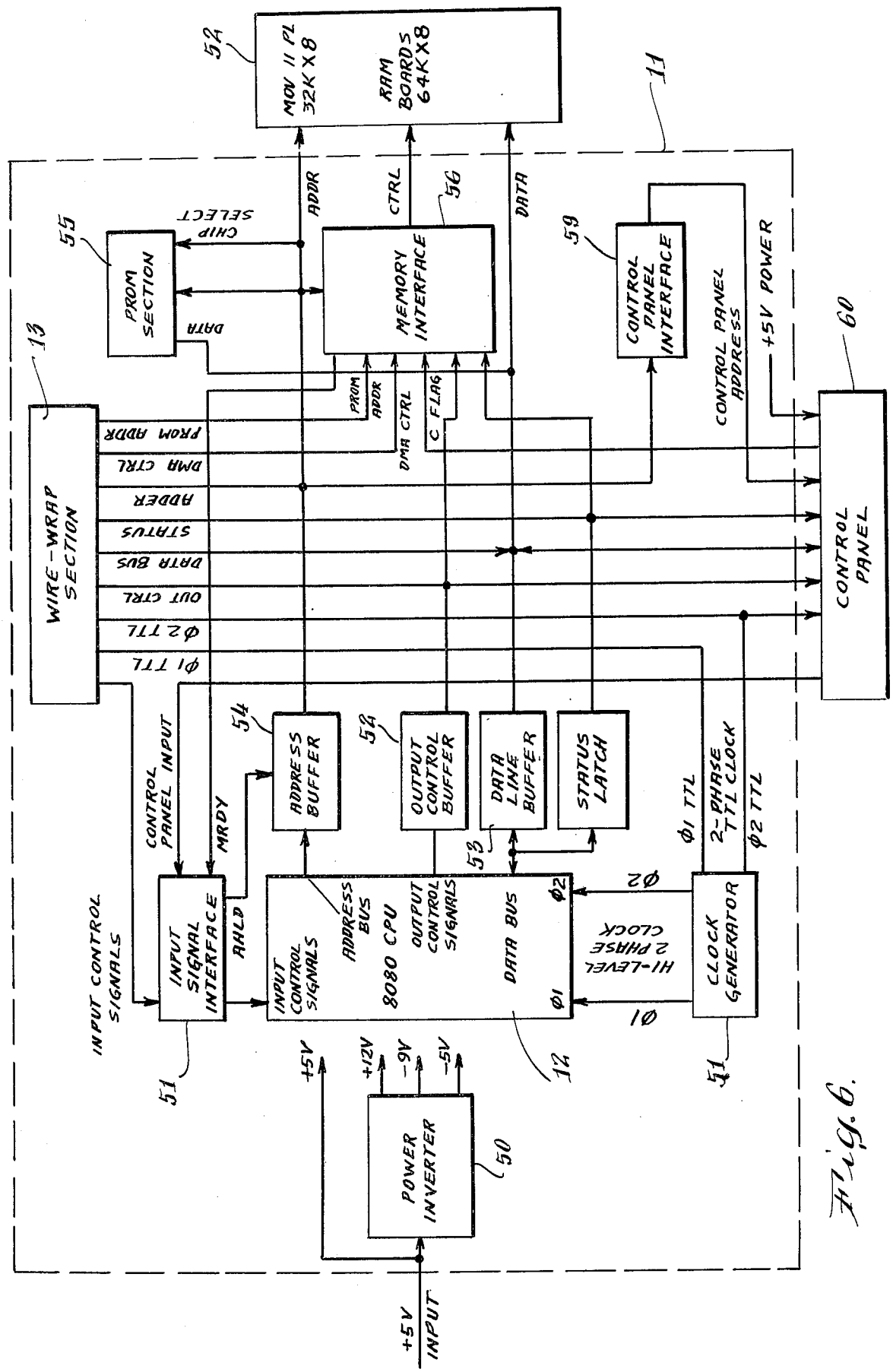
FIG. 6 is a block diagram of a microcomputer circuit that may be employed on the board of FIG. 1.

FIG. 6 illustrates a typical microcomputer circuit which may be provided on the portion 11 of the board, as enclosed in the dashed line block. For example, as discussed above, a power inverter 50 may be provided, connectible to an external DC source, for providing a plurality of operating voltages for the circuit. The circuit further includes a CPU chip 12, such as a type 8080. A clock generator 51 of conventional nature is connected to the chip 12, as well as to a connector 24 of the wire-wrap section. An input signal interface 51 is connected between the wire-wrap section and the chip 12, and output control buffers 52, data line buffers 53, and additional buffers 54 are also connected between the chip 12 and the connectors 24 of the wire-wrap section. The area 11 further includes a plurality of PROMs 55 connected to the chip 12 by way of the data line buffer. A memory interface 56 is provided for interconnection of the circuit with external RAM board 58, and a control panel interface 59 is provided on the board 10 with an external control panel 60. As discussed above, the interconnection of the component of the microcomputer are conventional, and hence FIG. 6 illustrates a conventional system. The invention is, of course, not limited to this particular arrangement, and additional components may be employed on the printed circuit portion 11 of the board 10. It is further apparent that the leads illustrated in FIG. 6 may be multiple leads, as indicated by the numbers in parentheses on these leads.

The microcomputer board, in accordance with the invention as above described, is particularly adaptable for bulk quantity customized systems, since it may be employed by engineers, scientists and students to solve a wide variety of application problems without major design problems. The board includes all of the basic elements for a microcomputer, including a power converter, so that a minimum of effort is required by the user to adapt the microcomputer to his particular requirements. As a consequence, the microcomputer board in accordance with the invention, enables a significant reduction in development costs and time in the provision of a microcomputer, as compared with unitary or modular microcomputer systems. The clock generator of the board may thus be a crystal clock, so that the clock frequencies are available for standard communication circuits.

The board thus may be considered to be a prototyping board which may be readily configured by the operator to a microcomputer of optimum input/output and memory combinations, by using the wire-wrap section. The operator may plug any desired combinations of elements, such as PROMs or RAMs in the wire-wrap section, and interconnect these elements with the connectors 24, 28, for optimum I/O combinations.

It is therefore apparent that the microcomputer board in accordance with the invention is readily adaptable to many uses, and has a maximum flexibility, so that the user is enabled to provide the desired system in a minimum of time and at a minimum of cost. In addition, the microcomputer may be expanded readily, by the interconnection of the board with further RAM boards. The wire-wrap section of the board included wire-wrap pins for all of the signals of the printed circuit, as well as wire-wrap pins unconnected to the printed circuit for adapting the system to the desired I/O. The voltage and ground planes of the wire-wrap section insure good noise immunity, as well as providing numerous wire-wrap pins for distribution of the voltages and ground throughout the wire-wrap section. As a consequence, the necessary interconnections of components inserted in the wire-wrap section may be readily and easily effected by the user.

In view of the above-described advantages of the microcomputer board in accordance with the invention, it is apparent that the board greatly extend the practical application of microcomputers to areas where cost and special conditions would otherwise inhibit or prevent the use of microcomputers. Thus, in specialized situations, the low cost advantages of mass produced microcomputer systems are not available, and the difficulties of adapting modular or other variable design microcomputers may also prevent the application of microcomputers to specialized systems. The present invention, however, provides a standardized basic microcomputer system, with the low cost advantages of mass production, while still enabling adapting the system to specialized conditions with a minimum of cost and a minimum of effort. All of the necessary terminals are available in the wire-wrap section, so that the user requires only a single card in many applications, and need only insert the required additional RAMs or PROMs or the like, and interconnect these devices to the available wire-wrap terminals.

In view of the use of the wire-wrap section, it is apparent that the microcomputer board in accordance with the invention may provide further cost and development time reduction in the provision of a microcomputer for special applications. Thus, the board is adaptable for insertion by the manufacturer in the wire-wrap section of additional circuitry such as PROMs, ROMs, RAMs, TTL compatible input and output ports with signals brought out to the input/output connectors, direct memory access circuits for high-speed memory transfers, priority interrupt circuits and communication circuits for serial communication. These advantages are apparent when it is considered that the development time for an entire circuit board may easily take more than 1000 man hours.

While the microcomputer board in accordance with the invention is particularly adaptable for hardware development, it can also be configured to allow rapid efficient software development. For this purpose, the programs of the device may be readily hand-coded by the interconnection of a hand-control panel with the board.

While the invention has been disclosed and described with reference to a single embodiment, it will be apparent that variations and modifications may be made therein, and it is intended in the following claims to cover each such variation and modification as falls within the true spirit and scope of the invention.

What is claimed is:

1. A microcomputer board comprising an insulating mounting board, first microcomputer components fixedly mounted to said insulating mounting board in a first area thereof, first and second pluralities of connector means having wire-wrap pins and fixedly mounted to said insulating mounting board, at least a pair of parallel rows of holes in said board in a second area thereof, individual connectors having wire-wrap pins mounted in said holes, and printed circuit means on said insulating mounting board interconnecting said microcomputer components and said first plurality of connector means and not extending directly to said individual connectors and said second connector means.

2. The microcomputer board of claim 1, further comprising a ground plane extending between said rows of holes on one of said mounting board and electrically connected to said printed circuit means.

3. The microcomputer board of claim 2, further comprising additional connectors having wire-wrap pins in said second area and connected to said ground plane.

4. The microcomputer board of claim 2, further comprising at least one voltage plane extending between said rows of holes on the other side of said mounting board and electrically connected to said printed circuit means.

5. The microcomputer board of claim 4, further comprising a first plurality of separate connectors in said second area and having wire-wrap pins and connected to said ground plane, and a second plurality of separate connectors in said second area having wire-wrap pins and connected to said voltage planes, all of said wire-wrap pins extending from said other side of said mounting board.

6. The microcomputer board of claim 5, wherein said first and second connector means are pin ribbon connectors.

7. The microcomputer board of claim 5 further comprising by-pass capacitors adjacent said other side of said mounting board and interconnecting said ground plane and said voltage planes by way of said first plurality of separate connectors.

8. The microcomputer board of claim 5, wherein said holes are spaced apart equally and aligned in adjacent rows for receiving dual in-line package integrated circuit components.

9. The microcomputer board of claim 5, wherein said microcomputer components comprise a central processing unit chip, and buffer means interconnecting said chip with said first plurality of connector means by way of said printed circuit means.

10. The microcomputer board of claim 9, wherein said microcomputer components further comprise an input signal interface connected between said central processing unit chip and said first plurality of connector means by way of said printed circuit means, and further comprising power inverter means connected to supply voltages to said printed circuit means and PROM means connected to said central processing unit chip by way of said printed circuit means.

11. The microcomputer board of claim 10, further comprising a third plurality of connector means on said insulating mounting board connected to said printed circuit and not having wire-wrap terminals, and memory and control panel interface circuits interconnecting said central processing unit chip and said third plurality of connector means.

* * * * *

UNITED STATES PATENT AND TRADEMARK OFFICE
CERTIFICATE OF CORRECTION

PATENT NO. : 4,031,371
DATED : June 21, 1977
INVENTOR(S) : Hubert G. DeVries

It is certified that error appears in the above-identified patent and that said Letters Patent are hereby corrected as shown below:

Column 1, line 40 change "enables" to --enabling--.

Column 2, line 11 change "thereof" to --of the board--.

Column 4, line 17 change "spaces" to --spacers--.

Column 4, line 45 change " component" to --components--.

Column 4, line 46 change "are" to --is--.

Column 4, line 63 omit --,-- after "consequence".

Column 4, line 64 insert --,-- after "board".

Column 5, line 19 change "included" to --includes--.

Column 5, line 32 change "extend" to --extends--.

Signed and Sealed this

First Day of November 1977

[SEAL]

Attest:

RUTH C. MASON
Attesting Officer

LUTRELLE F. PARKER
Acting Commissioner of Patents and Trademarks